(12) United States Patent
Yamada

(10) Patent No.: US 7,245,060 B2
(45) Date of Patent: Jul. 17, 2007

(54) PIEZOELECTRIC RESONATOR, METHOD FOR MANUFACTURING THE SAME, PIEZOELECTRIC FILTER, AND DUPLEXER

(75) Inventor: Hajime Yamada, Otsu (JP)

(73) Assignee: Murata Manufacturing Co., Ltd., Kyoto-Fu (JP)

(*) Notice: Subject to any disclaimer, the term of this patent is extended or adjusted under 35 U.S.C. 154(b) by 0 days.

(21) Appl. No.: 11/193,536

(22) Filed: Aug. 1, 2005

(65) Prior Publication Data

US 2006/0066175 A1    Mar. 30, 2006

(30) Foreign Application Priority Data

Sep. 24, 2004  (JP) .............................. 2004-277118

(51) Int. Cl.
*H01L 41/04* (2006.01)
(52) U.S. Cl. ...................................... 310/320; 310/360
(58) Field of Classification Search ................ 310/320, 310/357, 360
See application file for complete search history.

(56) References Cited

U.S. PATENT DOCUMENTS

| | | | |
|---|---|---|---|
| 5,532,537 A | 7/1996 | Koike et al. | |
| 2003/0112097 A1 | 6/2003 | Ma et al. | |
| 2003/0129307 A1 | 7/2003 | Lu et al. | |
| 2003/0213428 A1* | 11/2003 | Lu et al. | 117/104 |
| 2004/0196116 A1* | 10/2004 | Komuro et al. | 333/133 |

FOREIGN PATENT DOCUMENTS

| | | |
|---|---|---|
| GB | 1 299 237 | 12/1972 |
| JP | H06-132760 | 5/1994 |
| JP | H06-216699 | 8/1994 |
| JP | H07-038373 | 2/1995 |
| JP | H10-056354 | 2/1998 |
| JP | 2001-044794 | 2/2001 |
| JP | 2001-168674 | 6/2001 |
| JP | 2004-221622 | 8/2004 |

OTHER PUBLICATIONS

Machine translation of JP 2001-044794.*

* cited by examiner

Primary Examiner—Darren Schuberg
Assistant Examiner—Derek Rosenau
(74) Attorney, Agent, or Firm—Dickstein, Shapiro, LLP.

(57) ABSTRACT

A piezoelectric resonator suitable for use in a high frequency band is provided, in which variation in the piezoelectric material is reduced, variation in performance is reduced, and production can be performed without the need for a polarization treatment step. In the piezoelectric resonator, a piezoelectric material made of a wurtzite structure compound crystal is disposed, the crystal epitaxially grown in such a way that a (1,1,−2,0) crystal face becomes parallel to a surface of the R-plane sapphire substrate having a (0,1,−1,2) crystal face parallel to the substrate surface, and a pair of excitation electrodes are disposed on a pair of principal surfaces opposite to each other in the thickness direction of the piezoelectric material in such a way that the pair of excitation electrodes sandwich the C plane which is a (0,0,0,1) crystal face perpendicular to the (1,1,−2,0) crystal face of the tabular piezoelectric material.

20 Claims, 7 Drawing Sheets

US 7,245,060 B2

PIEZOELECTRIC RESONATOR, METHOD FOR MANUFACTURING THE SAME, PIEZOELECTRIC FILTER, AND DUPLEXER

BACKGROUND OF THE INVENTION

1. Field of the Invention

The present invention relates to a piezoelectric resonator which takes advantage of thickness longitudinal vibration. In particular, the present invention relates to a piezoelectric resonator having a structure in which a tabular piezoelectric material with a pair of excitation electrodes disposed on a pair of principal surfaces stands upright on a substrate, as well as a method for manufacturing the same, a piezoelectric filter including the piezoelectric resonator, and a duplexer.

2. Description of the Related Art

In recent years, as the frequencies of communications equipment have increased, various piezoelectric resonators and piezoelectric filters taking advantage of thin piezoelectric materials and piezoelectric thin films have been proposed. For example, FIG. 1 is a perspective view partially showing a piezoelectric resonator disclosed in Japanese Unexamined Patent Application Publication No. 2001-44794.

In a piezoelectric resonator 101, a piezoelectric plate 103 made of PZT stands upright on a sapphire substrate 102. Excitation electrodes 104 and 105 are disposed on opposing surfaces of the piezoelectric plate 103. The piezoelectric plate 103 is polarized in the direction in which the excitation electrodes 104 and 105 are opposite to each other, that is, in the thickness direction. Therefore, resonance characteristics taking advantage of thickness longitudinal vibration can be attained by applying an alternating-current electric field from the excitation electrodes 104 and 105. As for the above-described piezoelectric resonator 101, the frequency can be increased by decreasing the thickness of the piezoelectric plate 103.

In the production of the piezoelectric resonator 101, a sapphire substrate 102 is prepared, and a film of PZT piezoelectric ceramic is formed on the top surface 102a of the sapphire substrate 102 to reach a height equal to the height of the top surface 103a of the piezoelectric plate 103. Subsequently, the resulting piezoelectric film is processed by etching or the like to form the piezoelectric plate 103 having a thickness of about 2 μm or less. After the piezoelectric plate 103 is formed, the excitation electrodes 104 and 105 are formed on both surfaces of the piezoelectric plate 103. In this manner, the piezoelectric plate 103 having a reduced thickness can be disposed upright on the sapphire substrate 102. It is believed that a piezoelectric resonator usable in a GHz band can be provided since the piezoelectric plate 103 has the reduced thickness.

However, the thin piezoelectric plate 103 in the piezoelectric resonator 101 described in Japanese Unexamined Patent Application Publication No. 2001-44794, is composed of the PZT piezoelectric ceramic. Since the PZT piezoelectric ceramic contains three elements, Pb, Ti and Zr, as metal atoms, there is a problem in that the composition is hard to stabilize. That is, variation in performance tends to occur since the composition of the piezoelectric plate 103 is not stabilized.

In addition, the piezoelectric plate 103 is made of the piezoelectric ceramic and, therefore, as described above, a treatment step of polarizing the piezoelectric plate 103 in the thickness direction must be performed while the piezoelectric plate 103 stands upright. Consequently, the production process is complicated.

SUMMARY OF THE INVENTION

It is an object of the present invention to overcome the above-described problems in the known technologies and to provide a piezoelectric resonator which includes a piezoelectric plate standing upright on a substrate and which takes advantage of thickness longitudinal vibration, wherein variations in piezoelectric plate is minimized, so that variation in performance is minimized, and furthermore, production can readily be performed.

According to an aspect of the present invention, a piezoelectric resonator is provided, the piezoelectric resonator including an R-plane sapphire substrate having a (0,1,−1,2) crystal face parallel to the substrate surface; a tabular piezoelectric material made of a wurtzite structure compound crystal epitaxially grown in such a way that a (1,1,−2,0) crystal face becomes parallel to the above-described (0,1,−1,2) crystal face of the above-described R-plane sapphire substrate, the tabular piezoelectric material having a pair of principal surfaces; and a pair of excitation electrodes disposed on the above-described pair of principal surfaces opposite to each other in the thickness direction of the above-described piezoelectric material in such a way that the pair of excitation electrodes sandwich the C plane which is a (0,0,0,1) crystal face perpendicular to the (1,1,−2,0) crystal face of the above-described piezoelectric material.

In the piezoelectric resonator according to a specific aspect of the present invention, a plurality of piezoelectric materials made of the above-described wurtzite structure compound crystal are epitaxially grown on the above-described R-plane sapphire substrate, the above-described pair of excitation electrodes are disposed on each piezoelectric material in such a way that a plurality of piezoelectric resonant units are thereby constructed on the R-plane sapphire substrate, and the plurality of piezoelectric resonant units are connected in parallel or in series.

In the piezoelectric resonator according to the present invention, preferably, an insulating film is disposed to cover at least one excitation electrode of each pair of excitation electrodes.

According to another aspect of the present invention, a piezoelectric filter constructed by including the piezoelectric resonator constructed according to the present invention is provided.

According to another aspect of the present invention, a duplexer constructed by including the piezoelectric resonator or the piezoelectric filter constructed according to the present invention can be provided.

A method for manufacturing the piezoelectric resonator according to another aspect of the present invention includes the steps of forming a compound crystal by epitaxially growing a wurtzite structure compound crystal on an R-plane sapphire substrate having a (0,1,−1,2) crystal face parallel to the substrate surface in such a way that a (1,1,−2,0) crystal face becomes parallel to the substrate surface; forming a mask on the surface which is the (1,1,−2,0) crystal face of the compound crystal, in parallel to the C plane which is a (0,0,0,1) crystal face of the compound crystal; dry-etching the compound crystal after the mask is formed, so as to form a tabular piezoelectric material made of the compound crystal and having a pair of principal surfaces; and forming a pair of excitation electrodes on the above-described pair of principal surfaces of the piezoelectric material opposite to each other, in such a way that the pair of excitation electrodes sandwich the C plane which is the (0,0,0,1) crystal face perpendicular to the (1,1,−2,0) crystal face of the above-described piezoelectric material.

In the piezoelectric resonator according to the present invention, the piezoelectric material is constructed by epitaxially growing the wurtzite structure compound crystal in such a way that the (1,1,−2,0) crystal face becomes parallel to the above-described (0,1,−1,2) crystal face of the R-plane sapphire substrate, the (0,1,−1,2) crystal face parallel to the substrate surface. The pair of excitation electrodes are disposed on the pair of principal surfaces opposite to each other in the thickness direction of the piezoelectric material in such a way that the pair of excitation electrodes sandwich the C plane which is the (0,0,0,1) crystal face perpendicular to the (1,1,−2,0) crystal face of the piezoelectric material. Therefore, resonance characteristics taking advantage of thickness longitudinal vibration can be attained when an alternating-current electric field is applied in between the pair of excitation electrodes. Furthermore, the compatibility with an increase in frequency can readily be ensured by decreasing the thickness of the piezoelectric material.

In addition, since the above-described piezoelectric material is composed of the wurtzite structure compound crystal produced by epitaxial growth, that is, the piezoelectric material is a single crystal, variation in production is minimized, and no polarization treatment is required.

Consequently, a piezoelectric resonator compatible with an increase in frequency can be provided according to the present invention, wherein variation in production is reduced, no polarization treatment step is required, and the production process can be simplified.

That is, according to the present invention, in the piezoelectric resonator including the piezoelectric material standing upright on the R-plane sapphire substrate and the pair of excitation electrodes disposed on the pair of principal surfaces opposite to each other in the thickness direction of the piezoelectric material, it becomes possible to achieve a reduction of variation in performance and simplification of the production process.

In the case where a plurality of piezoelectric materials made of the above-described wurtzite structure compound crystal are epitaxially grown on the R-plane sapphire substrate, and the above-described pair of excitation electrodes are disposed on each piezoelectric material in such a way that a plurality of piezoelectric resonant units are constructed, a structure in which one R-plane sapphire substrate is used and the plurality of piezoelectric resonant units are connected in parallel or in series may be attained.

When an insulating film is disposed to cover at least one excitation electrode of the pair of excitation electrodes, it becomes possible to improve the frequency temperature characteristics of the piezoelectric resonator and improve the environmental resistance of the excitation electrodes of the piezoelectric resonator.

The piezoelectric filter according to the present invention is constructed by including the piezoelectric resonator constructed according to the present invention and, therefore, a piezoelectric filter can be provided while variation in performance is reduced and the production process is simplified.

In the case where the duplexer is constructed by including the piezoelectric resonator or the piezoelectric filter constructed according to the present invention as well, stabilization of the performance of the duplexer and cost reduction can be achieved.

The method for manufacturing a piezoelectric resonator according to the present invention includes the steps of forming the compound crystal by epitaxially growing the wurtzite structure compound crystal on the R-plane sapphire substrate having the (0,1,−1,2) crystal face parallel to the substrate surface in such a way that the (1,1,−2,0) crystal face becomes parallel to the substrate surface; forming the rectangular mask on the surface, which is the (1,1,−2,0) crystal face of the compound crystal, in parallel to the C plane which is the (0,0,0,1) crystal face of the piezoelectric material; dry-etching the compound crystal after the mask is formed, so as to form the tabular piezoelectric material made of the compound crystal; and forming the pair of excitation electrodes on the pair of principal surfaces opposite to each other in the thickness direction of the piezoelectric material in such a way that the pair of excitation electrodes sandwich the C plane which is the (0,0,0,1) crystal face perpendicular to the (1,1,−2,0) crystal face of the piezoelectric material. Consequently, the piezoelectric resonator of the present invention can readily be produced by undergoing the above-described epitaxial growth and dry-etching.

DESCRIPTION OF THE PREFERRED EMBODIMENTS

The present invention will be made clear by explaining specific embodiments of the present invention with reference to the drawings below.

As described above, the piezoelectric resonator including the PZT ceramic described in Japanese Unexamined Patent Application Publication No. 2001-44794 has a problem in that the composition is hard to stabilize since the PZT ceramic contains three metal elements, Pb, Ti and Zr. It is believed that such a problem is alleviated by using ZnO, AlN and the like, as the piezoelectric material. However, commercialization is difficult, in that as described in Paragraph No. 0030 of Japanese Unexamined Patent Application Publication No. 2001-44794, "if a piezoelectric material, e.g., ZnO or AlN, is used, the c axis must be oriented in parallel to the surface of a base material since the direction of polarization has been fixed, whereas this is technically difficult". On the other hand, a R-plane sapphire substrate is used and the compound single crystal is epitaxially grown on the R-plane sapphire substrate in the present invention, and, thereby, the C axis of the compound crystal can be oriented in parallel to the substrate surface of the R-plane sapphire substrate. This will be described with reference to specific embodiments.

Figure 2:
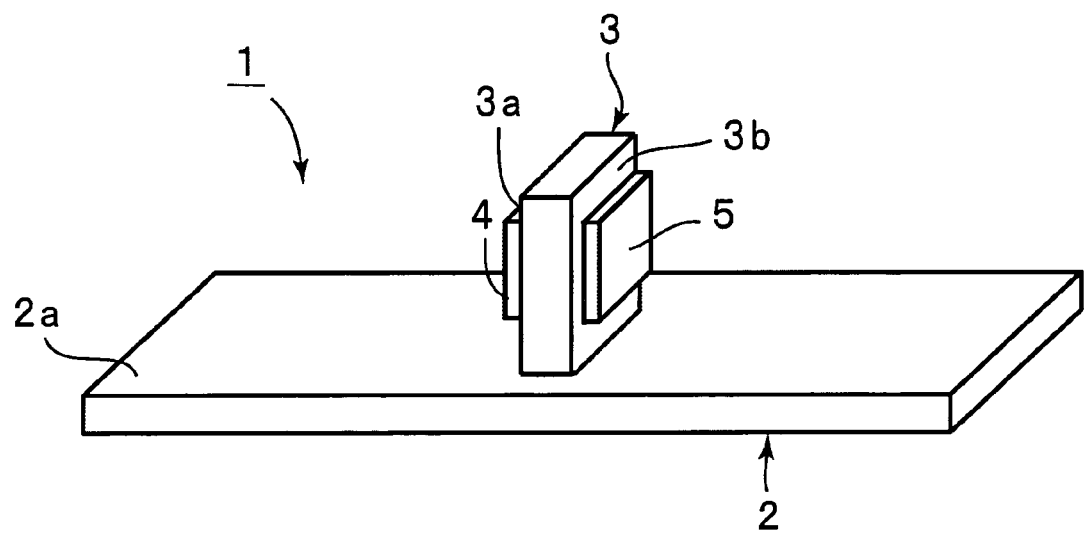
FIG. 2 is a perspective view showing a piezoelectric resonator according to a first embodiment of the present invention.

FIG. 2 is a perspective view showing a piezoelectric resonator according to the first embodiment of the present invention. A piezoelectric resonator 1 includes an R-plane sapphire substrate 2. The top surface 2a of the R-plane sapphire substrate 2 is the R-plane, that is, a (0,1,−1,2) crystal face. In the present embodiment, a rectangular plate-shaped piezoelectric plate 3 made of a compound single crystal primarily containing ZnO is disposed upright on the top surface 2a of the R-plane sapphire substrate 2. This piezoelectric plate 3 is formed by patterning a compound crystal epitaxially grown on the R-plane sapphire substrate, as described below. A (1,1,−2,0) crystal face of the piezoelectric plate 3 is made parallel to the (0,1,−1,2) crystal face which is the top surface of the sapphire substrate 2. Therefore, when an alternating-current voltage is applied in between a pair of principal surfaces 3a and 3b opposite to each other in the thickness direction of the piezoelectric plate 3, resonant characteristics based on the thickness longitudinal vibration can be attained. For the purpose thereof, excitation electrodes 4 and 5 are disposed on the pair of principal surfaces 3a and 3b in such a way that the excitation electrodes 4 and 5 sandwich the C plane, i.e. a (0,0,0,1) crystal face, perpendicular to the (1,1,−1,2) crystal face of the piezoelectric plate 3.

Since the piezoelectric plate 3 is composed of the compound crystal epitaxially grown on the R-plane sapphire substrate in the piezoelectric resonator 1 of the present embodiment, variation in performance is reduced, and no polarization treatment is required. Consequently, an inexpensive piezoelectric resonator 1 exhibiting stable performance can be provided. Furthermore, according to the present embodiment, a piezoelectric resonator usable in the GHz band and compatible with an increase in frequency can be provided, as is clear from the following specific production method.

The R-plane sapphire substrate 2 was prepared, and a piezoelectric thin film primarily containing ZnO was epitaxially grown to have a thickness of 10 μm on the top surface of the R-plane sapphire substrate 2. A rectangular resist pattern of 1.6 μm in width and 100 μm in length was formed on the thus produced piezoelectric thin film. The ZnO piezoelectric thin film not covered with the resist pattern was removed by reactive ion etching. Subsequently, the resist pattern was removed. In this manner, the piezoelectric plate 3 in the shape of a rectangular parallelepiped of 1.6 μm in width×100 μm in length×10 μm in height was formed on the R-plane sapphire substrate 2. The width is the thickness direction linking between the two principal surfaces 3a and 3b of the piezoelectric plate 3.

Excitation electrodes 4 and 5 made of Al having a film thickness of 0.1 μm were formed on the surfaces 3a and 3b opposite to each other in the thickness direction of the above-described piezoelectric plate 3. That is, resist patterns were formed on the principal surfaces 3a and 3b of the piezoelectric plate 3 and, thereafter, Al was evaporated from a slanting direction. Subsequently, unnecessary portions of the electrode films were lifted off together with the resist patterns, so that the excitation electrodes 4 and 5 were formed. In this manner, the excitation electrodes 4 and 5 were formed opposite to each other in a part of the piezoelectric plate 3. In the present example of production, the excitation electrodes 4 and 5 were opposed to each other in a rectangular region having a height direction dimension of 7 μm and a length direction dimension of 98 μm. The locations of the regions in which the excitation electrodes were formed were set at least one-quarter of the wavelength away from the top surface 2a of the R-plane sapphire substrate 2.

In this manner, the piezoelectric resonator 1 having a frequency constant of about 3.18 GHz·μm was produced. That is, the thickness of the piezoelectric plate 3 was 1.6 μm, and the resonant frequency was 2 GHz in the resulting piezoelectric resonator.

Figure 3:
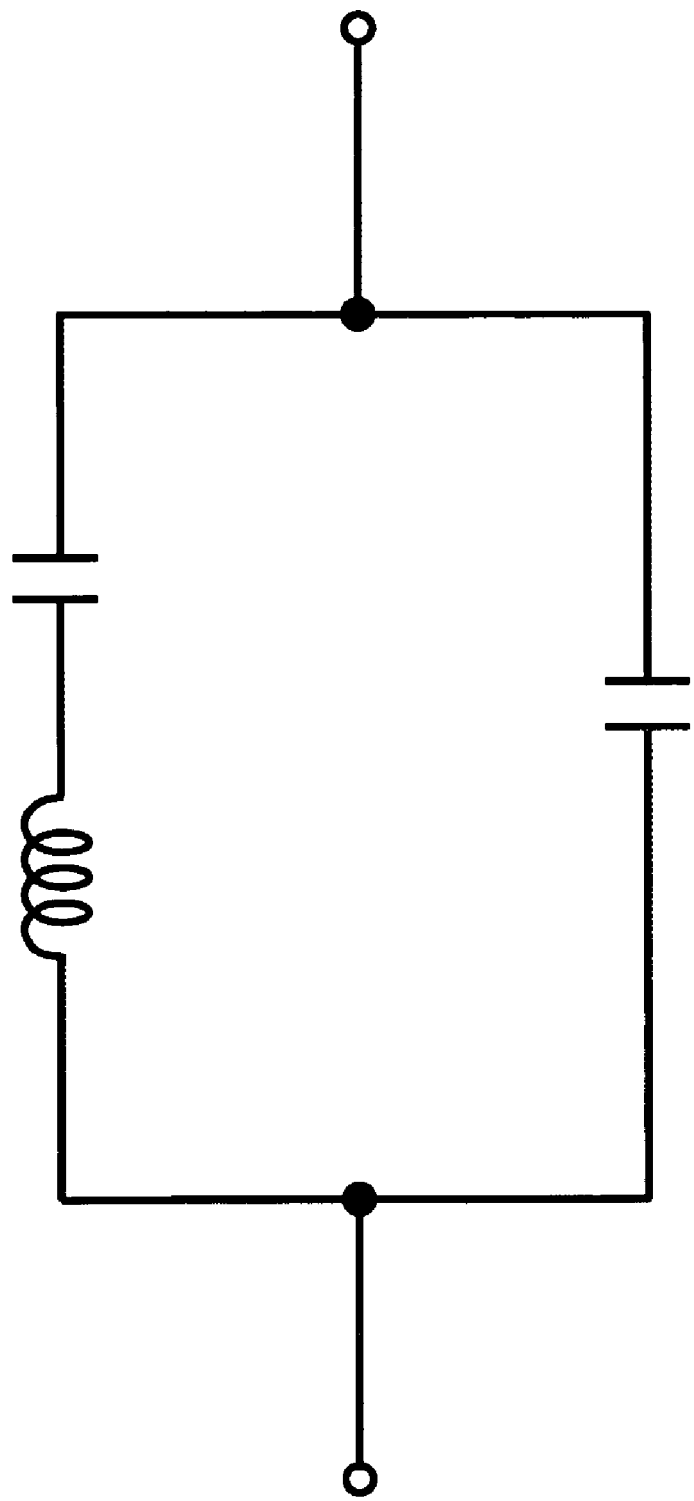
FIG. 3 is a diagram showing an equivalent circuit of the piezoelectric resonator of the first embodiment.

The piezoelectric resonator produced as described above was subjected to simulation based on an equivalent circuit shown in FIG. 3. As a result, the series resonant frequency Fs was 1765.0 MHz, the parallel resonant frequency fp was 1828.7 MHz, and the electromechanical coefficient $k^2$ was 7.1%.

In the above-described embodiment, the piezoelectric plate 3 is composed of ZnO. However, the compound crystal constituting the piezoelectric plate 3 is not limited to ZnO in the present invention. The piezoelectric plate 3 may be composed of various crystals, e.g., AlN, exhibiting the piezoelectric effect.

The width direction dimension of the above-described resist pattern becomes a thickness T of the finally produced piezoelectric plate 3. In the piezoelectric resonator 1, the thickness direction of the piezoelectric plate 3 is perpendicular to the C axis, and the excitation electrodes 4 and 5 are disposed in parallel to the C plane while sandwiching the C plane therebetween. When thickness longitudinal vibration is excited, the resonant frequency thereof is determined by dividing the frequency constant by the thickness T, that is, resonant frequency=(frequency constant of piezoelectric plate)/T.

In the above-described embodiment, the piezoelectric plate 3 is composed of ZnO. Therefore, the frequency constant thereof is 3.18 GHz·μm. On the other hand, the frequency constant of AlN is 5.2 GHz·μm. Since the frequency constant of AlN is larger than the frequency constant of ZnO. Consequently, a piezoelectric resonator of a higher frequency can be provided even when the thickness is the same by using AlN rather than ZnO.

The material for constituting the excitation electrode is not limited to Al. The excitation electrode may be constructed by using Cu or other metal or alloy. Furthermore, the excitation electrode may have a structure in which a plurality of electrode layers are laminated.

In the production method of the above-described embodiment, the resist pattern of 1.6 μm in width and 100 μm in length is formed after the piezoelectric thin film is formed, and ZnO in the unnecessary portion is removed by reactive ion etching. However, the removal method is not limited to the reactive ion etching. Other removal methods, e.g., wet etching and ion milling, may be used. Furthermore, other methods for forming a ZnO film may be used, such as one in which a resist pattern in a reverse tapered shape is formed, ZnO is formed by sputtering and, thereafter, patterning is performed by lift-off.

Figure 4:
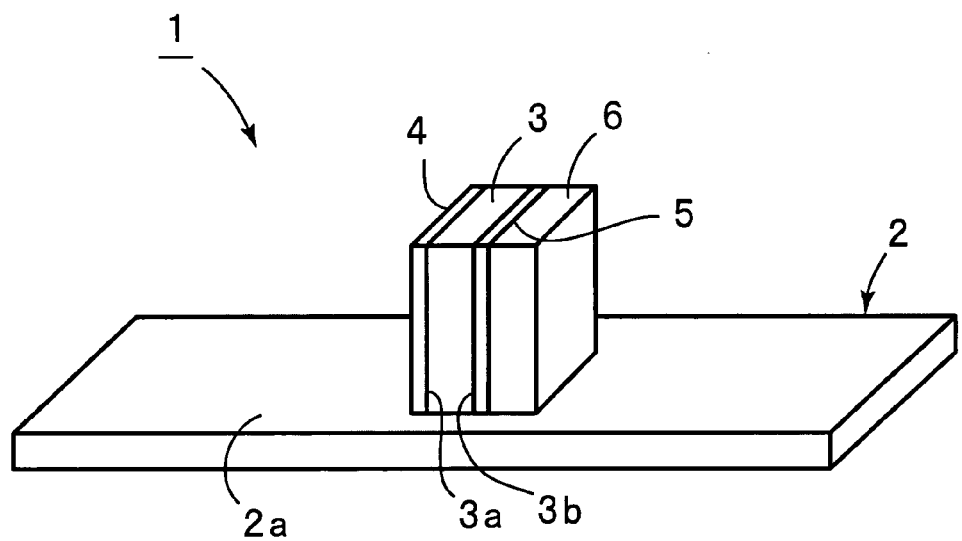
FIG. 4 is a perspective view showing a modified example of the piezoelectric resonator of the first embodiment.

FIG. 4 is a perspective view showing a modified example of the piezoelectric resonator 1. Here, an insulating film 6 made of $SiO_2$ is formed on the outer surface of one excitation electrode 5 of the piezoelectric resonator 1. As described above, an insulating film may be formed while covering at least one of the pair of excitation electrodes disposed on both surfaces of the piezoelectric plate 3 in the present invention. In the case where a $SiO_2$ film is formed as the insulating film 6, the absolute value of the temperature coefficient of resonant frequency can be decreased when the piezoelectric plate 3 has a negative temperature coefficient of resonant frequency since the $SiO_2$ film has a positive temperature coefficient of resonant frequency. Therefore, the frequency temperature characteristics can be improved. In this manner, the temperature characteristics can be improved when the insulating film is formed from an insulating material having polarity of the temperature coefficient of resonant frequency opposite to that of the piezoelectric plate 3.

The insulating film is not limited to the $SiO_2$ film, and may also be composed of various insulating materials, e.g., SiN.

Alternatively, the excitation electrode 5 may be protected by forming the insulating film 6 and, thereby, environmental resistance characteristics may also be improved.

The insulating film may be formed to cover both the pair of excitation electrodes 4 and 5.

Figure 5:
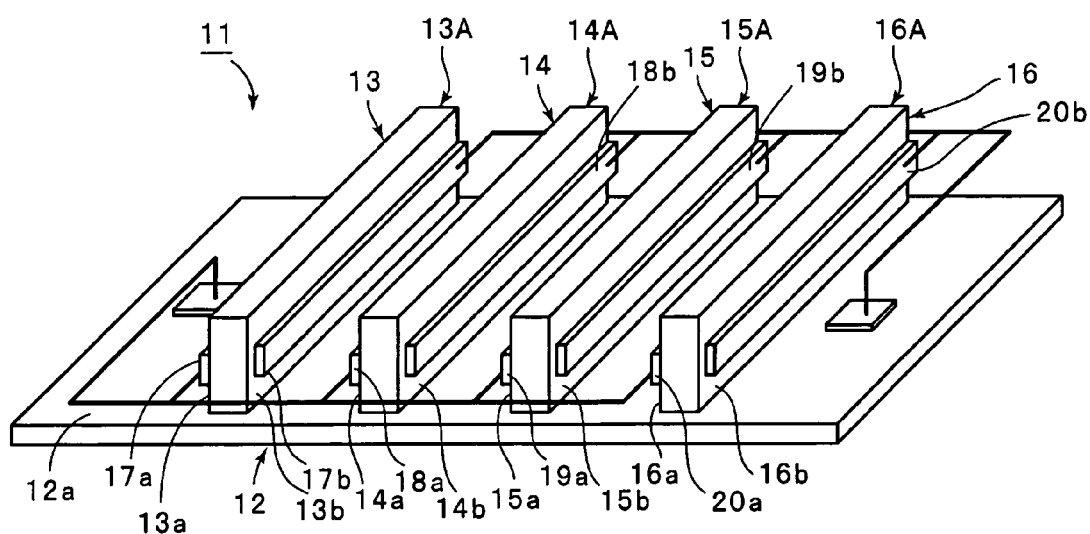
FIG. 5 is a perspective view showing a piezoelectric resonator according to a second embodiment of the present invention.

FIG. 5 is a perspective view showing a piezoelectric resonator according to the second embodiment of the present invention. In this piezoelectric resonator 11, a plurality of piezoelectric plates 13 to 16 are disposed upright on the top surface 12a of one R-plane sapphire substrate 12. Pairs of excitation electrodes 17a, 17b to 20a, 20b are disposed on pairs of surfaces 13a, 13b to 16a, 16b, respectively, opposite to each other in the thickness direction of the piezoelectric plates 13 to 16, respectively.

The piezoelectric plates 13 to 16 are disposed similarly to the piezoelectric plate 3 of the first embodiment.

Figure 1:
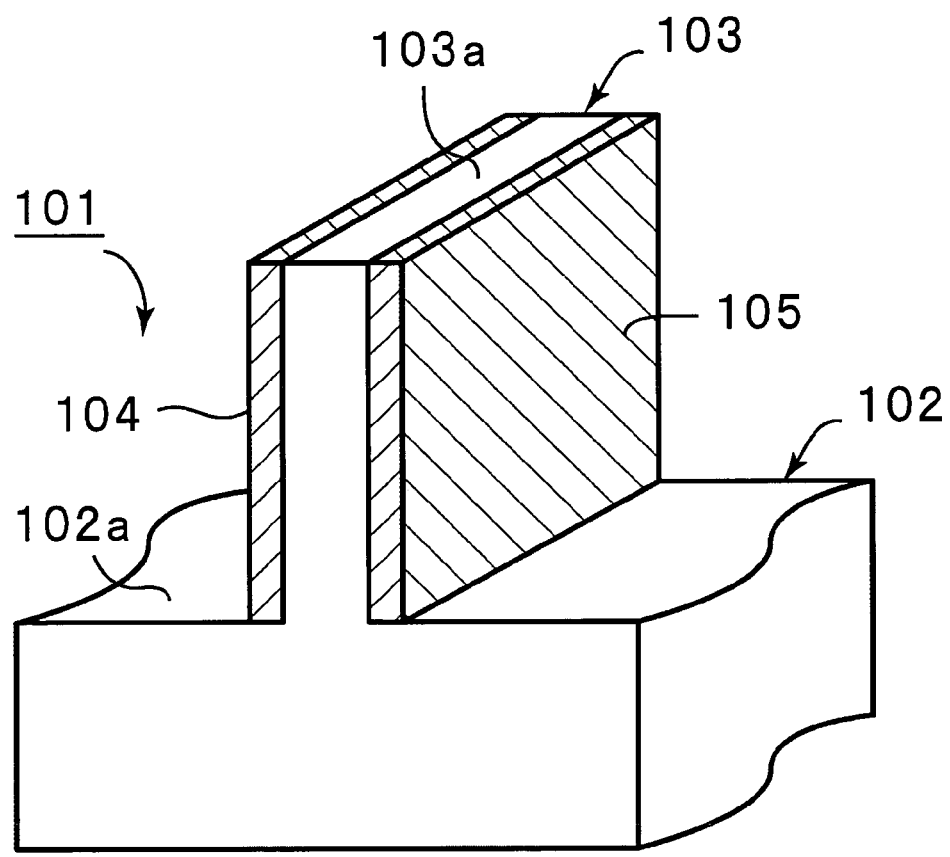
FIG. 1 is a perspective view showing an example of a known piezoelectric resonator.

That is, a plurality of piezoelectric resonant units 13A to 16A corresponding to the piezoelectric resonator 1 shown in FIG. 1 are integrally constructed on one R-plane sapphire substrate 12 in the piezoelectric resonator 11 of the second embodiment. The piezoelectric resonant units 13A to 16A are electrically connected in parallel as schematically shown in FIG. 5.

According to the results of the simulation on the piezoelectric resonator of the first embodiment, the capacitance is a small 0.013 pF. Therefore, the piezoelectric resonator 1 is unsuitable for use in a series arm resonator or a parallel arm resonator of a ladder filter since the capacitance of the piezoelectric resonator 1 is small.

On the other hand, the plurality of piezoelectric resonant units 13A to 16A are electrically connected in parallel in the piezoelectric resonator 11 of the second embodiment, so that the capacitance can be made adequately large. Consequently, a piezoelectric resonator usable as, for example, a series arm resonator or a parallel arm resonator of a ladder filter can be provided by electrically connecting the plurality of piezoelectric resonant units 13A to 16A in parallel.

A piezoelectric resonator to be used in a ladder filter must have an adequately large capacitance. Therefore, it is preferable that the opposed area of the pair of excitation electrodes opposite to each other is increased. In order to increase the opposed area of the excitation electrodes, the length×height of the piezoelectric plate 3 must be increased. However, if the length of the piezoelectric plate 3 is increased, the top surface 2a of the expensive R-plane sapphire substrate 2 must be enlarged. If the height of the piezoelectric plate 3 is increased, the piezoelectric plate 3 may be damaged due to mechanical impact.

However, where the plurality of piezoelectric resonant units 13A to 16A are connected in parallel to increase the capacitance, as in the second embodiment, a large capacitance can be attained without increasing the height of the piezoelectric plate 3 or increasing the length of the piezoelectric plate 3. Therefore, an inexpensive large-capacitance piezoelectric resonator having excellent impact resistance can be provided.

In the second embodiment, the plurality of piezoelectric resonant units 13A to 16A are electrically connected in parallel on one R-plane sapphire substrate 12. However, the plurality of piezoelectric resonant units 13A to 16A may be electrically connected in series.

In this case, the electric power resistance of the piezoelectric resonator can be improved since the terminal voltage of the piezoelectric resonator is divided into the plurality of piezoelectric resonant units 13A to 16A.

A plurality of piezoelectric resonators which include the plurality of piezoelectric resonant units electrically connected in parallel on one R-plane sapphire substrate 12 may be formed, and the plurality of piezoelectric resonators may be connected in series to form one piezoelectric resonator.

In this case, a piezoelectric resonator having a large capacitance and high electric power resistance can be produced.

Furthermore, the plurality of piezoelectric resonant units 13A to 16A are disposed on one R-plane sapphire substrate 12 so as to be electrically connected in parallel in the second embodiment. However, a plurality of piezoelectric resonant units may be constructed on one R-plane sapphire substrate, the plurality of piezoelectric resonant units may be electrically connected in manners shown in, for example, FIGS. 6 to 8, and thereby, various piezoelectric filters may be constructed.

Figure 6:
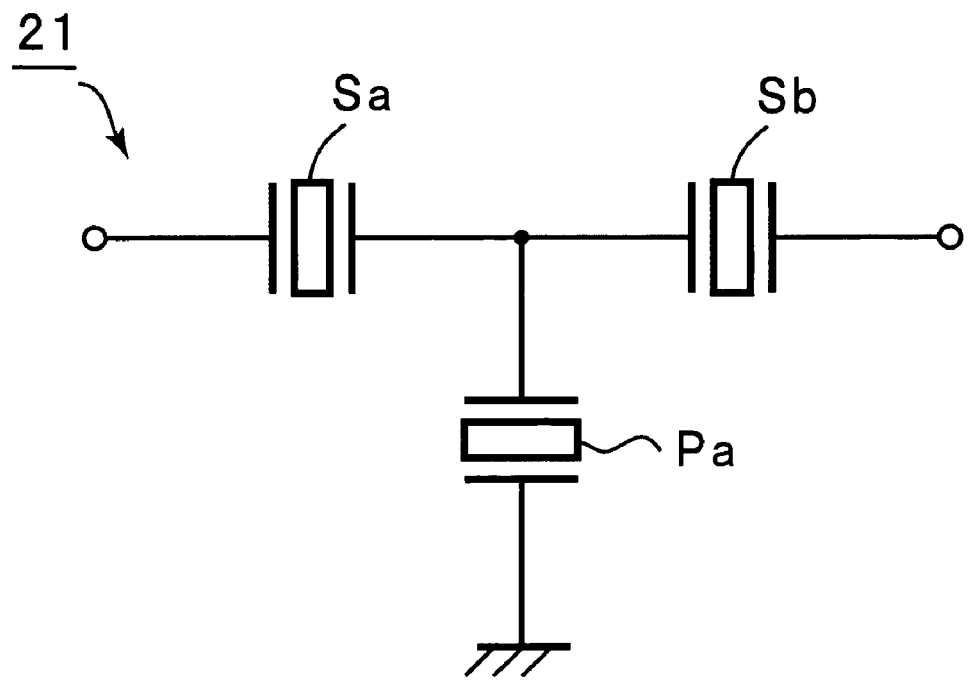
FIG. 6 is a circuit diagram showing an example of circuitry of a piezoelectric filter according to the present invention.

In a piezoelectric filter 21 shown in FIG. 6, series arm resonators Sa and Sb are connected between the input terminal and the output terminal, and a parallel arm resonator Pa is connected between a midpoint between series arm resonators Sa and Sb and an earth potential.

Figure 7:
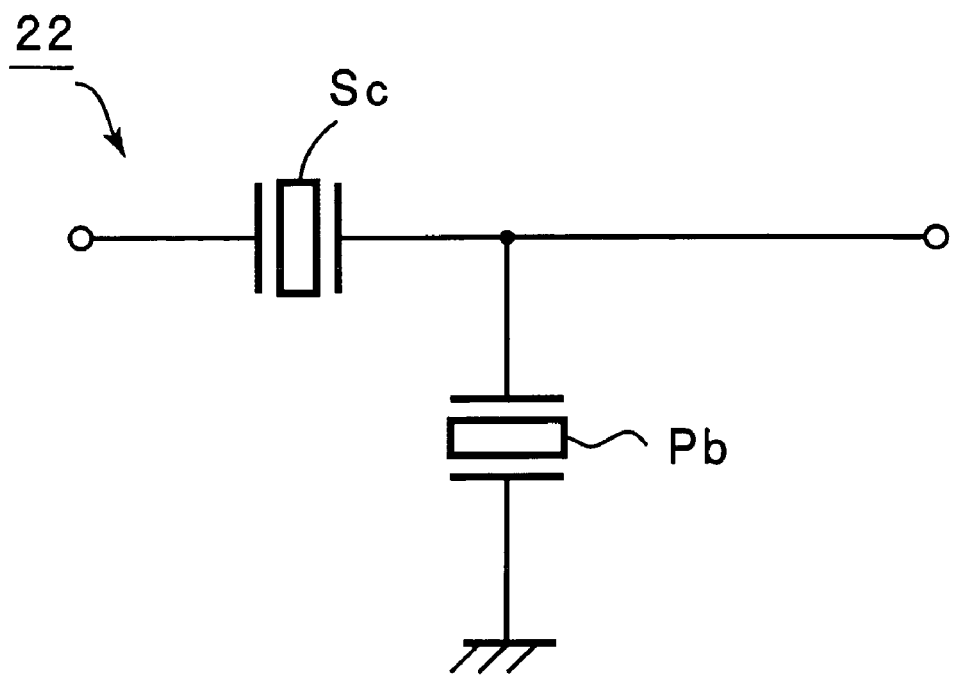
FIG. 7 is a circuit diagram showing another example of circuitry of the piezoelectric filter according to the present invention.

In a piezoelectric filter 22 shown in FIG. 7, a single-stage ladder filter including one series arm resonator Sc and one parallel arm resonator Pb is constructed.

Figure 8:
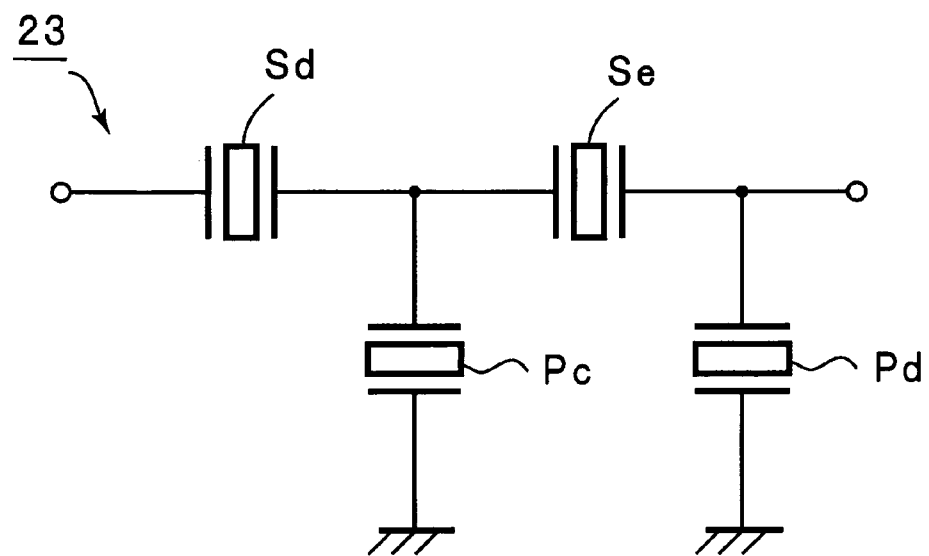
FIG. 8 is a circuit diagram showing another example of circuitry of the piezoelectric filter according to the present invention.

In a piezoelectric filter 23 shown in FIG. 8, a four-element two-stage ladder filter is constructed, in which two series arm resonators Sd and Se are connected in between the input terminal and the output terminal, and two parallel arm resonators Pc and Pd are connected between the series arm resonators and earth potentials.

As described above, piezoelectric filters having various circuitry can be constructed according to the present invention by using one R-plane sapphire substrate, constructing a plurality of piezoelectric resonant units on a substrate surface which is the (0,1,−1,2) crystal face of the R-plane sapphire substrate, and appropriately connecting each of the piezoelectric resonant units in series and/or in parallel.

The series resonators Sa to Se and parallel resonators Pa to Pd shown in FIG. 6 to FIG. 8 may be piezoelectric resonators in which the plurality of piezoelectric resonant units of the second embodiment are connected in parallel.

Figure 9:
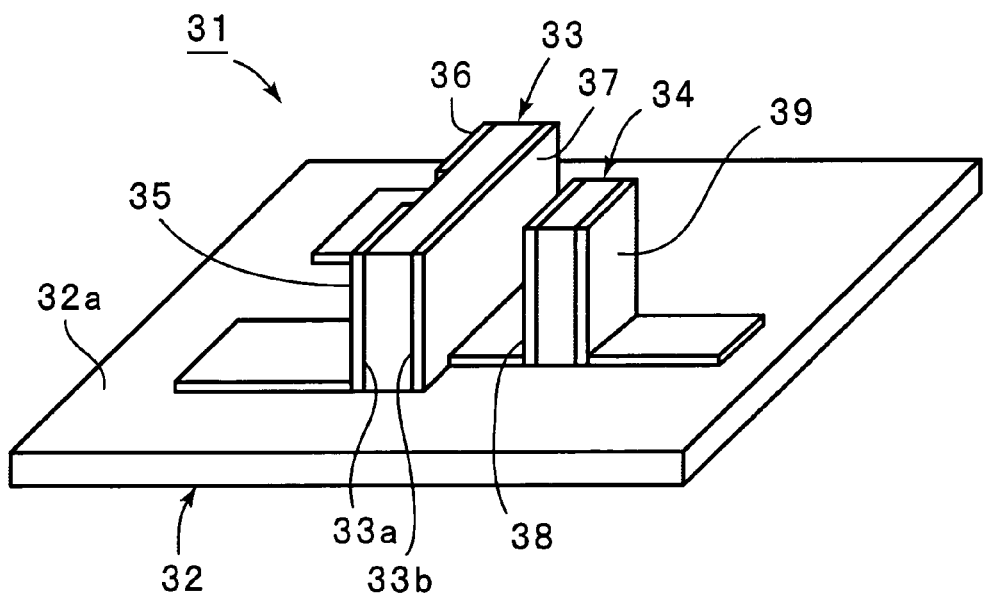
FIG. 9 is a perspective view showing a piezoelectric resonator according to a third embodiment of the present invention.

FIG. 9 is a perspective view showing a piezoelectric resonator according to the third embodiment of the present invention.

In a piezoelectric resonator 31, as in the first embodiment, piezoelectric plates 33 and 34 made of a wurtzite type crystal primarily containing ZnO are disposed upright on an R-plane sapphire substrate 32 having a surface 32a. Excitation electrodes 35, 36, 37, 38, and 39 are disposed on respective surfaces of a pair of surfaces of the piezoelectric plate 33 and a pair of surfaces of the piezoelectric plate 34 opposite to each other in the thickness direction of the piezoelectric plates 33 and 34. Here, the excitation electrodes 35 and 36 are disposed with a gap therebetween on the principal surface 33a of the piezoelectric plate 33. The excitation electrode 37 is disposed on the principal surface 33b opposite to the principal surface 33a. The excitation electrode 37 is opposite to the excitation electrodes 35 and 36 with the piezoelectric plate 33 therebetween. The excitation electrode 37 is electrically connected to the excitation electrode 38 disposed on one of the principal surfaces of the piezoelectric plate 34.

Consequently, in the present embodiment, a three-terminal type piezoelectric resonant unit including the piezoelectric plate 33 and the piezoelectric resonant unit including the piezoelectric plate 34 are electrically connected. Therefore, the piezoelectric resonator 31 can be used as the piezoelectric filter 21 shown in FIG. 6 when the excitation electrode 35 is connected to the input terminal, the excitation electrode 36 is connected to the output terminal, and the excitation electrode 39 is connected to the earth potential.

In the present invention, as described above, the excitation electrode disposed on the piezoelectric plate may be divided into a plurality of excitation electrodes on at least one of the principal surfaces of the piezoelectric plate.

Figure 10:
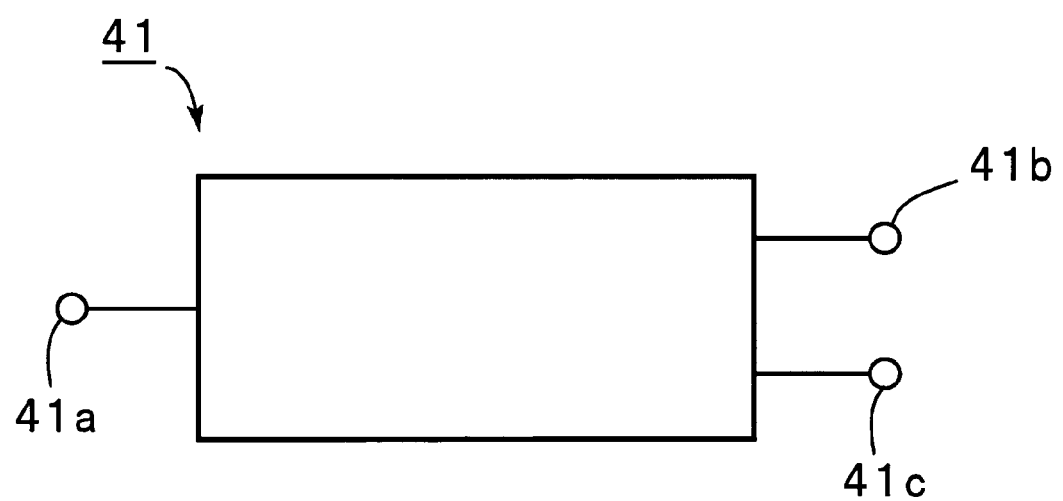
FIG. 10 is a block diagram for explaining a duplexer constructed according to the present invention.

A duplexer according to the present invention is constructed by including the piezoelectric resonator or the piezoelectric filter constructed according to the present invention. FIG. 10 is a diagram schematically showing the configuration of such a duplexer. As shown in FIG. 10, a duplexer 41 is a three-terminal type circuit element connected to an antenna terminal 41a, a transmitting terminal 41b, and a receiving terminal 41c. The duplexer 41 can be configured to include, for example, piezoelectric filters 21 to 23 shown in FIG. 6 to FIG. 8 as a transmitting band-pass filter or a receiving band-pass filter. In that case, according to the present invention, the performance is stable and simplification of the production process can be achieved.

The piezoelectric resonator according to the present invention can be used for various purposes in addition to the resonator constituting the ladder filter. Therefore, in the case where a large capacitance is not required, for example, the piezoelectric resonator 11 of the first embodiment can be used as a discrete piezoelectric resonator.

What is claimed is:

1. A piezoelectric resonator comprising:
    an R-plane sapphire substrate having a (0,1,−1,2) crystal face parallel to a surface the substrate and having at least one piezoelectric resonant unit on said surface;
    wherein the piezoelectric resonant unit comprises a tabular piezoelectric material of a wurtzite structure compound crystal epitaxially grown such that a (1,1,−2,0) crystal face is parallel to the (0,1,−1,2) crystal face of the R-plane sapphire substrate, the tabular piezoelectric material having a pair of principal surfaces; and
    a pair of excitation electrodes disposed on the pair of principal surfaces opposite to each other in the thickness direction of the piezoelectric material such that the pair of excitation electrodes sandwich the C plane which is a (0,0,0,1) crystal face perpendicular to the (1,1,−2,0) crystal face of the piezoelectric material.

2. The piezoelectric resonator according to claim 1, having a plurality of the piezoelectric resonant units on said surface.

3. The piezoelectric resonator according to claim 2, wherein the plurality of piezoelectric resonant units are connected in parallel.

4. The piezoelectric resonator according to claim 2, wherein the plurality of piezoelectric resonant units are connected in series.

5. The piezoelectric resonator according to claim 4, wherein an insulating film is disposed so as to cover at least one excitation electrode of each pair of excitation electrodes.

6. The piezoelectric resonator according to claim 3, wherein an insulating film is disposed so as to cover at least one excitation electrode of each pair of excitation electrodes.

7. The piezoelectric resonator according to claim 2, wherein an insulating film is disposed so as to cover at least one excitation electrode of each pair of excitation electrodes.

8. The piezoelectric resonator according to claim 1, wherein an insulating film is disposed so as to cover at least one of the pair of excitation electrodes.

9. A piezoelectric filter comprising the piezoelectric resonator according to claim 8.

10. A piezoelectric filter comprising the piezoelectric resonator according to claim 2.

11. A piezoelectric filter comprising the piezoelectric resonator according to claim 1.

12. A duplexer comprising the piezoelectric filter according to claim 11.

13. A duplexer comprising the piezoelectric filter according to claim 10.

14. A duplexer comprising the piezoelectric filter according to claim 9.

15. A duplexer comprising the piezoelectric resonator according to claim 1.

16. A duplexer comprising the piezoelectric resonator according to claim 2.

17. A duplexer comprising the piezoelectric resonator according to claim 8.

18. A method for manufacturing the piezoelectric resonator according to claim 1, the method comprising:
    epitaxially growing a wurtzite structure compound crystal on an R-plane sapphire substrate having a (0,1,−1,2) crystal face parallel to the substrate surface in such a way that a (1,1,−2,0) crystal face of the wurtzite structure compound crystal becomes parallel to the substrate surface;
    shaping the wurtize structure compound crystal so as to have realize a tabular piezoelectric material which has a pair of principal surfaces opposite to each other and which sandwich the C plane which is the (0,0,0,1) crystal face perpendicular to the (1,1,−2,0) crystal face of the piezoelectric material; and
    forming a pair of excitation electrodes on the pair of principal surfaces of the piezoelectric material opposite to each other, in such a way that the pair of excitation electrodes sandwich said C plane.

19. The method of claim 18 in which the shaping comprises forming a mask on the surface which is the (1,1,−2,0) crystal face of the compound crystal, and etching the compound crystal after the mask is formed so as to form a piezoelectric material of the compound crystal having a pair of principal surfaces which sandwich the C plane.

20. The method of claim 18 in which a plurality of wurtzite structure compound crystals are grown, shaped and have a pair of excitation electrodes formed on a pair of principal surfaces.

* * * * *